United States Patent
Meng et al.

(10) Patent No.: US 12,416,490 B1
(45) Date of Patent: Sep. 16, 2025

(54) METHOD AND CHEMICAL MECHANICAL PLANARIZATION DEVICE FOR IN-SITU MEASUREMENT OF FILM THICKNESS

(71) Applicant: BEIJING TSD SEMICONDUCTOR CO., LTD., Beijing (CN)

(72) Inventors: Weitao Meng, Beijing (CN); Huiyan Zhou, Beijing (CN); Jile Jiang, Beijing (CN)

(73) Assignee: BEIJING TSD SEMICONDUCTOR CO., LTD., Beijing (CN)

( * ) Notice: Subject to any disclaimer, the term of this patent is extended or adjusted under 35 U.S.C. 154(b) by 0 days.

(21) Appl. No.: 19/060,371

(22) Filed: Feb. 21, 2025

Related U.S. Application Data

(63) Continuation of application No. PCT/CN2024/135879, filed on Nov. 29, 2024.

(30) Foreign Application Priority Data

May 29, 2024 (CN) .......................... 202410682381.X

(51) Int. Cl.
  *G01B 11/06* (2006.01)
  *B24B 37/013* (2012.01)
  (Continued)

(52) U.S. Cl.
  CPC ........ *G01B 11/0625* (2013.01); *B24B 37/013* (2013.01); *B24B 49/12* (2013.01); *H01L 21/304* (2013.01); *H01L 22/26* (2013.01)

(58) Field of Classification Search
  CPC ..... B24B 7/228; B24B 37/005; B24B 37/013; B24B 37/04; B24B 37/042; B24B 37/10; B24B 37/105; B24B 49/02; B24B 49/03; B24B 49/04; B24B 49/12; G01B 11/0625; H01L 21/304; H01L 22/26
  See application file for complete search history.

(56) References Cited

U.S. PATENT DOCUMENTS 6,563,586 B1 * 5/2003 Stanke .................... B24B 49/12
                                                     257/E21.53
6,623,991 B2 * 9/2003 Johnson ................. G01B 11/30
                                                     257/E21.53

(Continued)

FOREIGN PATENT DOCUMENTS

CN     101755189 A    6/2010
CN     101791781 A    8/2010

(Continued)

*Primary Examiner* — Joel D Crandall
(74) *Attorney, Agent, or Firm* — Nitin Kaushik

(57) ABSTRACT

Disclosed is a method and chemical mechanical planarization device for in-situ measurement of film thickness, the method including: generating a measured spectrum based on a reflection spectrum of a wafer film and an equivalent light source spectrum, where the equivalent light source spectrum is data of a correspondence between wavelength and light intensity generated using reflected light passing through a slurry and a dielectric layer between the slurry and a collimated light source probe; matching the measured spectrum with a reference spectrum library; and obtaining a thickness of the wafer film corresponding to a reference spectrum that matches the measured spectrum as a detection result.

12 Claims, 4 Drawing Sheets

(51) Int. Cl.
   *B24B 49/12*    (2006.01)
   *H01L 21/304*   (2006.01)
   *H01L 21/66*    (2006.01)

(56) References Cited

U.S. PATENT DOCUMENTS

| | | | | |
|---|---|---|---|---|
| 6,690,473 | B1* | 2/2004 | Stanke | B24B 37/34 |
| | | | | 356/369 |
| 7,042,580 | B1* | 5/2006 | Stanke | G01B 11/0625 |
| | | | | 356/601 |
| 2012/0034845 | A1* | 2/2012 | Hu | B24B 37/205 |
| | | | | 451/6 |
| 2012/0164917 | A1* | 6/2012 | Kobata | B24B 37/205 |
| | | | | 451/6 |
| 2012/0196511 | A1* | 8/2012 | David | B24B 37/105 |
| | | | | 451/6 |
| 2020/0258214 | A1* | 8/2020 | Motamedi | G06T 5/73 |
| 2023/0010759 | A1* | 1/2023 | Oh | B24B 37/013 |
| 2023/0311267 | A1* | 10/2023 | Kimba | B24B 49/12 |
| | | | | 451/56 |

FOREIGN PATENT DOCUMENTS

CN    116330147 A    6/2023
WO    WO-9964205 A1 *  12/1999  ......... B24B 37/013

\* cited by examiner

METHOD AND CHEMICAL MECHANICAL PLANARIZATION DEVICE FOR IN-SITU MEASUREMENT OF FILM THICKNESS

CROSS-REFERENCE TO RELATED APPLICATIONS

The application claims priority to Chinese patent application No. 202410682381.X, filed on May 29, 2024, the entire contents of which are incorporated herein by reference.

TECHNICAL FIELD

The present invention relates to the technical field of wafer parameter measurement, and in particular, to a method and chemical mechanical planarization device for in-situ measurement of film thickness.

BACKGROUND

Chemical Mechanical Planarization (CMP) is a global surface planarization technology used to reduce the impact of wafer thickness changes and surface topography during a semiconductor manufacturing process. During a CMP process, a carrier head is used to press a wafer onto the surface of a polishing pad to polish the surface of the wafer relying on the relative movement between the wafer and a polishing pad and by virtue of abrasive particles in a slurry. Some CMP processes require the removal of a transparent or translucent single-layer film on the wafer (including a substrate and the single-layer film formed thereon). For the CMP processes, it is very important to control the thickness of the single-layer film during polishing, that is, to determine whether the film layer has been planarized to the required flatness or thickness, or to determine when the required amount of material has been removed. Therefore, any changes in the thickness of the single-layer film need to be obtained accurately in real time so that the polishing pressure and time can be adjusted in real time, the polishing endpoint can be accurately controlled, and over- or under-planarization can be avoided.

When an optical non-contact reflectance method is used for in-situ measurement of film thickness of a wafer, various dielectrics exist between the wafer and the probe, such as air, glass, PU, and slurry. For the measurement of film thickness of a wafer with a multi-layer dielectric structure, different dielectric structures of each layer have different effects on the reflectance spectrum of the wafer in different degrees and in different ways, and the various dielectrics will significantly increase modeling difficulty and cause interference to the model in theoretical reflectance spectrum modeling computation. Therefore, how to avoid the impact of too many dielectric layers on theoretical reflectance spectrum modeling is a technical problem required to be solved urgently in the related art.

Since CMP has been used in the semiconductor manufacturing and processing industry, in-situ measurement of film thickness of a wafer during processing has not yet been achieved.

SUMMARY

In view of the foregoing, the present application provides a method for in-situ measurement of film thickness, including:

generating a measured spectrum based on a reflection spectrum of a wafer film and an equivalent light source spectrum, where the equivalent light source spectrum is data of a correspondence between wavelength and light intensity generated using reflected light passing through a slurry and a dielectric layer between the slurry and a collimated light source probe;

matching the measured spectrum with a reference spectrum library; and obtaining a thickness of the wafer film corresponding to a reference spectrum that matches the measured spectrum as a detection result.

Optionally, before generating a measured spectrum based on a reflection spectrum of a wafer film and an equivalent light source spectrum, the method further includes:

obtaining the reflected light that is emitted by the collimated light source probe, reflected by a reflector, and passes through the dielectric layer; and generating the equivalent light source spectrum using the reflected light.

Optionally, the dielectric layer includes a light-transmitting sealing layer disposed on a polishing disc and a polishing pad, and a bulk water layer formed by the slurry.

Optionally, the reference spectrum library is a collection of reference spectra generated for given thicknesses of the wafer film using a spectrum computation model, the spectrum computation model includes spectral parameters of the wafer, and spectral parameters of a near-surface layer formed by substances between bulk water on a surface of the wafer film and the surface of the wafer film.

Optionally, the spectral parameters of the wafer include spectral parameters of the wafer film and spectral parameters of a wafer substrate.

Optionally, the spectral parameters of the wafer film include a refractive index $n_2$ thereof, and the spectral parameters of the wafer substrate include a refractive index $n_3$ thereof.

Optionally, the near-surface layer is a surface-equivalent layer for simulating the substances between the bulk water on the surface of the wafer film and the surface of the wafer film.

Optionally, spectral parameters of the surface-equivalent layer include a refractive index $n_1'$ thereof.

Optionally, before matching the measured spectrum with a reference spectrum library, the method further includes:

obtaining the spectrum computation model;

determining the spectral parameters of the surface-equivalent layer, the wafer film, and the wafer substrate; and computing reference spectra at different given thicknesses of the wafer film using the spectral parameters and the spectrum computation model.

Optionally, the near-surface layer includes a first layer and a second layer, and the second layer is disposed between the first layer and the wafer film.

Optionally, spectral parameters of the first layer include a refractive index $n_1$ thereof, and spectral parameters of the second layer include a refractive index $n_4$ and thickness $d_4$ thereof.

Optionally, before matching the measured spectrum with a reference spectrum library, the method further includes:

obtaining the spectrum computation model;

determining the spectral parameters of the first layer, the wafer film, the second layer, the wafer film, and the wafer substrate; and computing reference spectra at different given thicknesses of the wafer film using the spectral parameters and the spectrum computation model.

The present application further provides an endpoint detection method for wafer film grinding, including:

using the method for in-situ measurement of film thickness described above to monitor in real time whether a thickness of a wafer film reaches a target thickness; and stopping grinding when the thickness of the wafer film reaches the target thickness.

Accordingly, the present application provides an electronic device, including: a processor and a memory connected to the processor, where the memory stores instructions that can be executed by the processor, and the instructions are executed by the processor to cause the processor to perform the method described above.

The present application further provides a chemical mechanical planarization device, including:

a light-transmitting channel, configured to run through a polishing disc and a polishing pad;

a sealing layer, configured to be encapsulated on the light-transmitting channel, where the sealing layer and a slurry on the polishing pad form an in-situ measurement environment;

a collimated light source probe, configured to emit collimated light to the light-transmitting channel and receive reflected light from a surface of a wafer film; and a measuring device, configured to perform the method described above.

Optionally, the sealing layer includes a first sealing layer encapsulated on the light-transmitting channel of the polishing pad, and a second sealing layer encapsulated on the light-transmitting channel of the polishing disc.

Optionally, the first sealing layer is made of a material including PU; and the second sealing layer is made of a material including glass.

According to the method and device for in-situ measurement provided by the embodiments of the present invention, the light emitted from the slurry by the collimated light source probe through the light-transmitting channel is equivalent to the equivalent light source spectrum, and the measured spectrum is obtained by using equivalent light sources to avoid the impact of several dielectric layers in the measurement environment on the spectrum. By matching the measured spectrum with the reference spectrum library, the thickness of the wafer film can be obtained to achieve in-situ measurement in a chemical mechanical planarization environment and ensure highly accurate measurement results.

Based on actual needs, this solution can be used for in-site and real-time measurement of film thickness of a wafer in a CMP environment, thereby greatly improving the efficiency and accuracy of semiconductor manufacturing and processing.

BRIEF DESCRIPTION OF THE DRAWINGS

To describe the technical solutions in the embodiments of the present invention or in the prior art more clearly, the following briefly describes the accompanying drawings needed for describing the embodiments or the prior art. Apparently, the accompanying drawings in the following description show some embodiments of the present invention, and those of ordinary skill in the art may further derive other accompanying drawings from these accompanying drawings without making creative efforts.

DETAILED DESCRIPTION OF THE EMBODIMENTS

An explicit and complete description of the technical solutions in the present invention will be given below in conjunction with the accompanying drawings. Apparently, the described embodiments are part, but not all, of the embodiments of the present invention. Based on the embodiments in the present invention, all other embodiments obtained by those of ordinary skill in the art without making creative efforts shall fall within the protection scope of the present invention.

In addition, the technical features involved in different embodiments of the present invention described below can be combined with each other as long as they do not conflict with each other.

Figure 1:
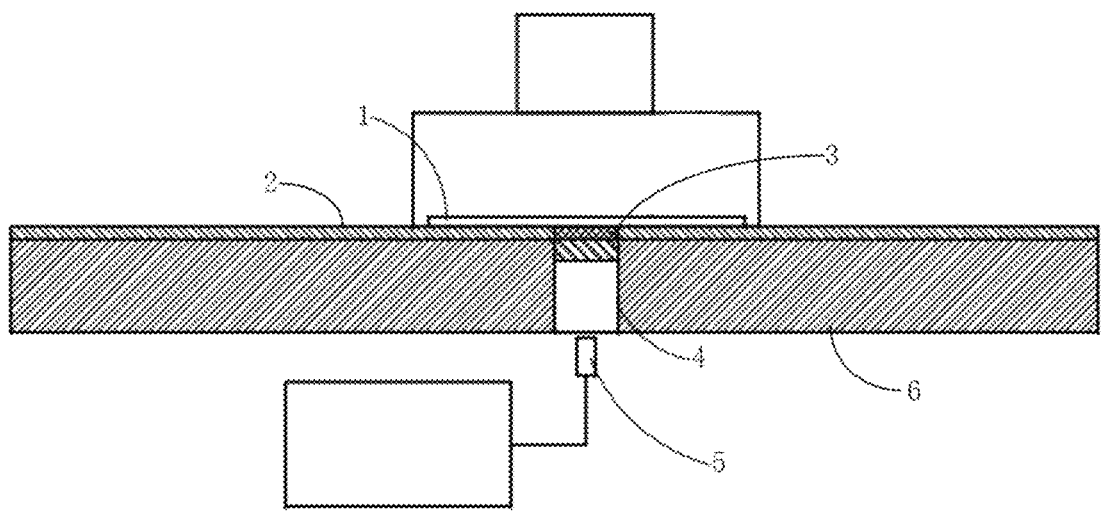
FIG. 1 is a schematic diagram of a scene for in-situ measurement of film thickness according to an embodiment of the present invention.

As shown in FIG. 1, an embodiment of the present invention provides a chemical mechanical planarization device, including:

a light-transmitting channel 4, configured to run through a polishing disc 6 and a polishing pad 2; and a sealing layer 3, configured to be encapsulated on the light-transmitting channel 4. The sealing layer 3 may include one or more layers. In this embodiment, two sealing layers are adopted, including a first sealing layer encapsulated on the light-transmitting channel of the polishing pad 2, and a second sealing layer encapsulated on the light-transmitting channel of the polishing disc 6. When the sealing layer 3 includes more than one layers, the materials thereof may be the same or different. In this embodiment, the first sealing layer is made of a material including polyurethane (PU), and the second sealing layer is made of a material including glass.

A collimated light source probe 5, configured to emit collimated light to the light-transmitting channel 4 and receive reflected light from a surface of a wafer film. A wafer 1 includes a wafer film and a wafer substrate. In the orientation shown in FIG. 1, the lower surface of the wafer 1 is the surface of the wafer film. During polishing, a slurry (bulk water) exists between the surface of the wafer film and the polishing pad 2.

The reflected light from the surface of the wafer film passes through the bulk water, the sealing layer 3, air, or other environmental media in the light-transmitting channel 4 in sequence, and then enters the collimated light source probe 5.

Figure 2:
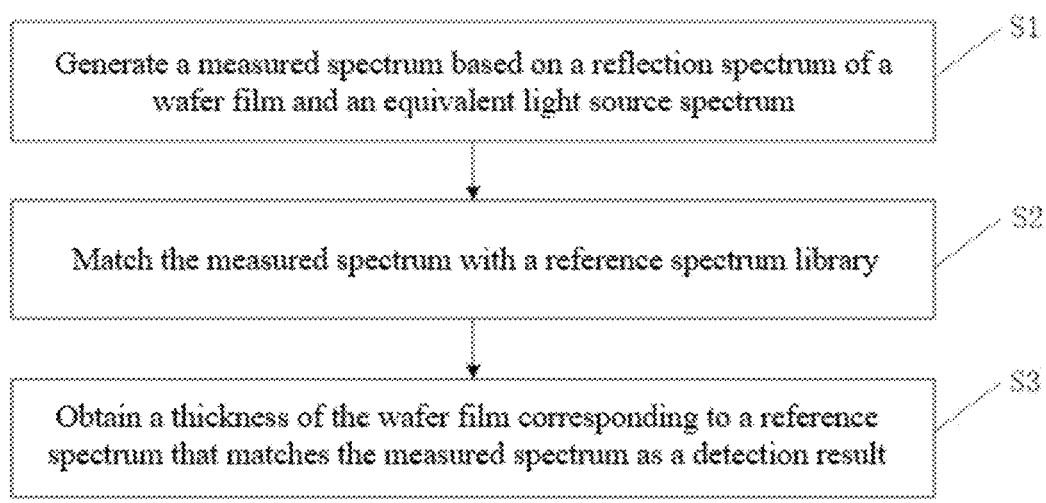
FIG. 2 is a flowchart of a method for in-situ measurement of film thickness according to an embodiment of the present invention.

A measuring device for in-situ measurement of film thickness. For the environment shown in FIG. 1, the measuring device determines the thickness of the wafer film of the wafer 1 based on the reflected light collected by the collimated light source probe 5. As shown in FIG. 2, a method for in-situ measurement of film thickness performed by the measuring device includes the following operation steps:

S1: generating a measured spectrum based on a reflection spectrum of a wafer film and an equivalent light source spectrum, where the equivalent light source spectrum is data of a correspondence between wavelength and light intensity generated using reflected light passing through a slurry and a dielectric layer between the slurry and a collimated light source probe. The reflection spectrum is data of a correspondence between wavelength and light intensity, and the measured spectrum is data of a correspondence between wavelength and reflectance. In this embodiment, the light emitted from the slurry by the collimated light source probe 5 through the light-transmitting channel 4 is equivalent to the equivalent light source spectrum.

Specifically, a reflector is placed on the polishing pad 2 with the slurry added to the polishing pad 2 before placing the wafer 1; the light emitted by the collimated light source probe 5 toward the light-transmitting channel 4 reaches the reflector; and the light reflected by the reflector passes through the slurry (bulk water), the sealing layer 3, and air, and then enters the collimated light source probe 5 so that the equivalent light source spectrum is obtained based on the reflected light passing through various dielectric layers.

The structure of the planarization device determines the various dielectric layers through which the reflected light passes. In the structure shown in FIG. 1, the dielectric layers through which the reflected light passes include a light-transmitting sealing layer 3 disposed on the polishing disc and the polishing pad (including the first and second sealing layers), and a bulk water layer formed by the slurry. In other embodiments, there may be more or fewer layers in the light-transmitting channel, and the light source spectrum generated by the reflected light passing through the various dielectric layers is the equivalent light source spectrum.

S2: matching the measured spectrum with a reference spectrum library. The reference spectrum library is a collection of reference spectra corresponding to different thickness values of the wafer film. The reference spectrum is data of a correspondence between wavelength and reflectance. By comparing all the reference spectra with the measured spectrum one by one, a reference spectrum similar to the measured spectrum can be determined. There are many methods to compute a similarity between two spectra, and there are also many indexes to measure the similarity or a matching degree, such as a similarity method, a nonlinear regression method, and an FFT method.

The reference spectrum can be measured data, such as a spectrum collected for a wafer film of known thickness, and the thickness of the wafer film is measured using a non-spectral, contact, or non-contact instrument and method.

S3: obtaining a thickness of the wafer film corresponding to a reference spectrum that matches the measured spectrum as a detection result. The reference spectrum and the measured spectrum can be expressed by a curve, in other words, the reference spectrum and the measured spectrum can be a curve of a correspondence between wavelength and reflectance. In this embodiment, the correspondence between wavelength and reflectance can be deformed by technologies in the art according to actual needs, and for those of ordinary skill in the art, other changes or modifications in different forms can be made on the basis of the above description. It is neither necessary nor impossible to exhaust all the embodiments herein. However, any obvious changes or modifications derived thereof still fall within the protection scope of the present invention.

Assuming that the thickness of the wafer film corresponding to the reference spectrum that matches the measured spectrum is 700 nm, the detection result is that the thickness of the wafer film is 700 nm.

According to the method and device for in-situ measurement provided by the embodiments of the present invention, the light emitted from the slurry by the collimated light source probe through the light-transmitting channel is equivalent to the equivalent light source spectrum, and the measured spectrum is obtained by using equivalent light sources to avoid the impact of several dielectric layers in the measurement environment on the spectrum. By matching the measured spectrum with the reference spectrum library, the thickness of the wafer film can be obtained to achieve in-situ measurement in a chemical mechanical planarization environment and ensure accurate measurement results.

In an embodiment, the reference spectrum is data generated using a spectrum computation model, and the spectrum computation model includes spectral parameters of the wafer, and spectral parameters of a near-surface layer formed by substances between bulk water on a surface of the wafer film and the surface of the wafer film.

Specifically, the spectrum computation model is a set of computational formulas. By substituting the values of the spectral parameters into the computational formulas, the reflectance corresponding to the spectral parameters can be obtained. Specifically, the spectrum computation model can be expressed as follows: $f(x)=R$, where x represents the spectral parameters, and R represents the reflectance. The spectral parameters include at least the wavelength $\lambda$ and thickness $d_2$ of the wafer film. When all the spectral parameters are determined or given, the corresponding reflectance can be obtained.

This method computes the reflectance R corresponding to a given wavelength range $\lambda$ for different given $d_2$, thereby obtaining reference spectra corresponding to different $d_2$.

Furthermore, a wafer includes a wafer film and a wafer substrate, spectral parameters of the wafer film include a refractive index $n_2$ thereof, and spectral parameters of the wafer substrate include a refractive index $n_3$ thereof.

In an embodiment, the near-surface layer is a surface-equivalent layer for simulating the substances between the bulk water on the surface of the wafer film and the surface of the wafer film. That is to say, if it is known that substances exist between the surface of the wafer film and the bulk water, the substances are considered as one layer of substance.

In this embodiment, spectral parameters of the surface-equivalent layer include a refractive index $n_1'$ thereof.

Accordingly, a reference spectrum can be computed as follows:
  obtaining a spectrum computation model;
  determining spectral parameters of the surface-equivalent layer, the wafer film, and the wafer substrate; and
  computing reference spectra at different given thicknesses of the wafer film using the spectral parameters and the spectrum computation model.

Specifically, in this embodiment, the spectrum computation model includes parameters of the surface-equivalent layer and the wafer, and the surface-equivalent layer is configured to simulate a layer formed by the substances between the bulk water on the surface of the wafer film and the surface of the wafer film.

Determining spectral parameters of the surface-equivalent layer, the wafer film, and the wafer substrate. The spectral parameters of the surface-equivalent layer can be obtained by theoretical computation. The spectral parameters of the wafer film and the wafer substrate are usually known or can be measured.

The substances between the bulk water and the surface of the wafer film can be a type of substance, such as air, or they can be multiple layers of substances, and these layers will affect the spectrum of reflected light from the wafer film. In order to avoid this effect, this embodiment provides a surface-equivalent layer to simulate the substances between the wafer film and the bulk water, and introduces relevant parameters of the surface-equivalent layer when constructing the spectrum computation model.

In an embodiment, the spectral parameters include a refractive index $n_1'$ of the surface-equivalent layer, a refractive index $n_2$ of the wafer film, and a refractive index $n_3$ of the wafer substrate.

As an example, the spectrum computation model may be as follows:

$$R = r \cdot r^*,$$

where r represents a total reflection coefficient determined based on $n_1'$, $n_2$, and $n_3$; $r^*$ represents a conjugate complex number of r; and R represents reflectance.

In an embodiment, the total reflection coefficient r is computed as follows:

a reflection coefficient of the interface of each layer is computed based on $n_1'$, $n_2$, and $n_3$; a phase thickness $\theta$ of the wafer film is computed based on $n_2$, $\lambda$ representing a wavelength, and $d_2$ representing a thickness; and the total reflection coefficient r is computed based on the reflection coefficient of the interface of each layer and the phase thickness $\theta$.

Furthermore, the reflection coefficient of the interface of each layer includes a reflection coefficient $r_1$ of the interface between the surface-equivalent layer and the wafer film, and a reflection coefficient $r_2$ of the interface between the wafer film and the wafer substrate.

The computation of the reflection coefficient of the interface of each layer includes: computing $r_1$ based on $n_1'$ and $n_2$, and computing $r_2$ based on $n_2$ and $n_3$.

As an example, r can be computed as follows:

$$r = \frac{r_1 + r_2 \cdot e^{i \cdot 2\theta}}{1 + r_1 \cdot r_2 \cdot e^{i \cdot 2\theta}},$$

where i is an imaginary unit, and e is a natural constant. Furthermore, $r_1$ and $r_2$ are computed as follows:

$$r_1 = \frac{n_1 - n_2}{n_1 + n_2},$$
$$r_2 = \frac{n_2 - n_3}{n_2 + n_3},$$

$\theta$ is computed as follows:

$$\theta = \frac{4\pi n_2 d_2}{\lambda},$$

For the above computational formulas, simple modifications may be made according to actual needs, for example, adding a preset coefficient or weight to one of the computational formulas, or the like. For those of ordinary skill in the art, other changes or modifications in different forms can be made on the basis of the above description. It is neither necessary nor impossible to exhaust all the computational formulas herein. However, any obvious changes or modifications derived thereof still fall within the protection scope of the present invention.

The reference spectrum computed in this embodiment is used for comparison with the measured spectrum of the wafer in an online state (grinding state or to-be-ground state), and the collection of reference spectra corresponding to different thicknesses of the wafer film is called the reference spectrum library.

The reference spectrum generation method provided by this embodiment of the present invention introduces the surface-equivalent layer structure and parameters thereof into the spectral computation model. This surface-equivalent layer is configured to simulate the substances between the bulk water on the surface of the wafer film and the wafer film in the grinding scene, and the computed spectra at different given thicknesses of the wafer film reflect the phenomenon of deformation, which is consistent with what appears in the measured spectra. Therefore, the reference spectrum library generated by this technical solution to measure the thickness of the wafer film can improve accuracy.

In an embodiment, a method for determining spectral parameters of a surface-equivalent layer is provided, including:

obtaining a measured spectrum in a state in which a surface of a wafer has the surface-equivalent layer, where the wafer includes a wafer substrate and a wafer film, parameters of the wafer substrate and the wafer film are known parameters measured in advance; and generating theoretical spectra under different given spectral parameters of the surface-equivalent layer by using a spectrum computation model. The spectrum computation model and the theoretical spectrum generation method may refer to the above-described embodiments regarding the reference spectrum. The difference from the process of generating a reference spectrum is that the spectral parameters of the wafer film and the wafer substrate are fixed values, and the spectral parameters of the surface-equivalent layer include multiple given values.

Specifically, the parameters involved in the spectrum computation model include a refractive index $n_1'$ of the surface-equivalent layer, a refractive index $n_2$ of the wafer film, and a refractive index $n_3$ of the wafer substrate, where $n_2$ and $n_3$ are known, and multiple $n_1'$ denoted by $[n_{1i}', n_{1j}']$ are given in this embodiment.

In this embodiment, the thickness $d_2$ of the wafer film is a known fixed value, and multiple theoretical spectra corresponding to $[n_{1i}', n_{1j}']$ are computed using the spectrum computation model.

The spectral parameters of the surface-equivalent layer are determined based on the theoretical spectra and the measured spectrum. Specifically, multiple theoretical spectra can be matched with the measured spectrum, some of which with a matching degree higher than a threshold are screened out, and the corresponding refractive index is denoted by $[n_{1i}', n_{1j}']$; and if the threshold is set high enough, it is possible to obtain a theoretical spectrum matching the measured spectrum, and the corresponding refractive index is denoted by $n_{1p}'$.

Figure 3:
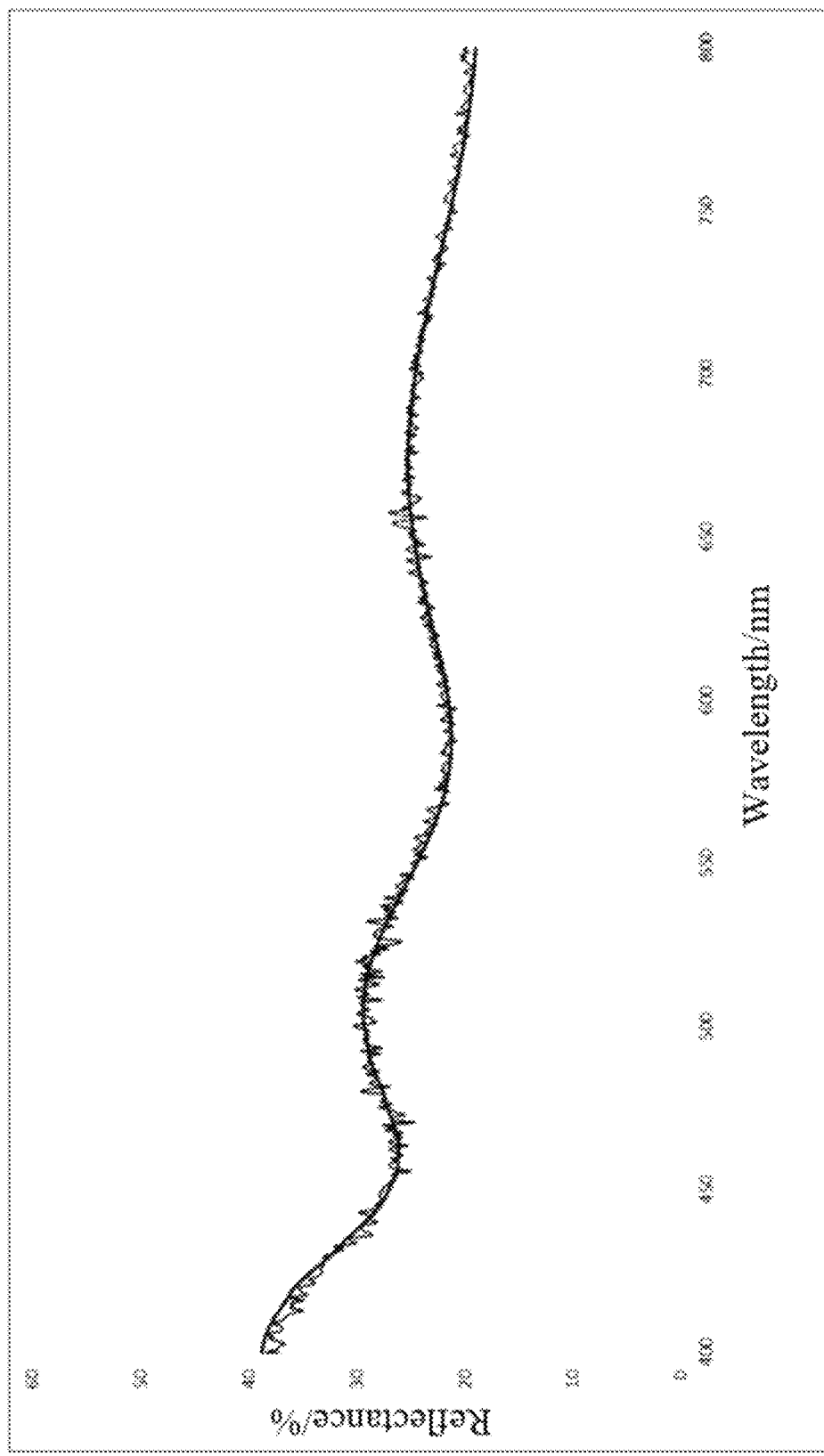
FIG. 3 is a comparison chart between a measured spectrum and a theoretical spectrum according to an embodiment of the present invention.

Therefore, a value can be selected from $[n_{1i}', n_{1j}']$ as the spectral parameter of the surface-equivalent layer, or $n_{1p}'$ is taken as the spectral parameter of the surface-equivalent layer. FIG. 3 shows a curve of the measured spectrum with obvious fluctuations in the y-coordinate and a curve of the theoretical spectrum with relatively smooth fluctuations in the y-coordinate. If a similarity between these two curves is high enough, the refractive index of the surface-equivalent layer of the theoretical spectrum can be determined as a definitive result.

In this embodiment, the theoretical spectra are generated based on given spectral parameters of multiple surface-equivalent layers, and the values of the spectral parameters of the surface-equivalent layers are determined by matching with the measured spectrum, thereby solving the problem that the spectral parameters of the near-surface layer are difficult to measure and improving measure accuracy.

In an embodiment, the near-surface layer includes a first layer and a second layer, where the second layer is disposed between the first layer and the wafer film. That is to say, if it is known that substances exist between the surface of the wafer film and the bulk water, the substances are considered as two layers of substances.

In this embodiment, spectral parameters of the first layer include a refractive index $n_1$ thereof, and spectral parameters of the second layer include a refractive index $n_4$ and thickness $d_4$ thereof.

Accordingly, a reference spectrum can be computed as follows:
  obtaining a spectrum computation model;
  determining the spectral parameters of the first layer, the wafer film, the second layer, the wafer film, and the wafer substrate; and
  computing reference spectra at different given thicknesses of the wafer film using the spectral parameters and the spectrum computation model.

Specifically, the spectrum computation model of this embodiment has parameters of the first layer and the second layer. In this embodiment, multiple layers are considered to exist between the bulk water and the wafer film; the dielectric in direct contact with the bulk water is generally air (forming the first layer); and another dielectric (forming the second layer) exists between the air layer and the wafer film.

The first layer and the second layer will affect the spectrum of reflected light from the wafer film. In order to avoid this effect, this embodiment provides two layers to simulate the layers formed by various dielectrics between the wafer film and the bulk water, and introduces relevant parameters of the two layers when constructing the spectrum computation model.

For example, the first layer can be considered as a layer formed by air, so its spectral parameters can be valued according to air, and the spectral parameters of the second layer can be obtained through theoretical computation.

Specifically, the spectrum computation model is a set of computational formulas. By substituting the values of the spectral parameters into the computational formulas, the reflectance corresponding to the spectral parameters can be obtained. Specifically, the spectrum computation model can be expressed as follows: $f(x)=R$, where x represents the spectral parameters, and R represents the reflectance. The spectral parameters include at least the wavelength $\lambda$ and thickness $d_2$ of the wafer film, and also include the spectral parameters of the first layer and the second layer in this embodiment.

The thickness $d_2$ of the wafer film has multiple different given values, and the curves computed based on different values $d_2$ are different. This method computes the reflectance R corresponding to a given wavelength range $\lambda$ for different given $d_2$, thereby obtaining reference spectra corresponding to different $d_2$.

In an embodiment, the spectral parameters include a refractive index $n_1$ of the first layer, a refractive index $n_2$ of the wafer film, a refractive index $n_3$ of the wafer substrate, a refractive index $n_4$ of the second layer, and a thickness $d_4$ of the second layer.

As an example, the spectrum computation model may be as follows:

$$R = r \cdot r^*,$$

where r represents a total reflection coefficient determined based on $n_1$, $n_2$, $n_3$, $n_4$, and $d_4$; $r^*$ represents a conjugate complex number of r; and R represents reflectance. According to the above model, for each given $d_2$, R under each $\lambda$ can be computed, thereby obtaining reference spectrum data.

In an embodiment, the total reflection coefficient r is computed as follows:
  a reflection coefficient of the interface of each layer is computed based on $n_1$, $n_2$, $n_3$, and $n_4$; a phase thickness $\theta$ of the wafer film is computed based on $n_2$, $\lambda$ representing a wavelength, and $d_2$ representing a thickness; a phase thickness $\alpha$ of the second layer is computed based on $n_4$, $\lambda$ representing a wavelength, and $d_4$ representing a thickness; and the total reflection coefficient r is computed based on the reflection coefficient of the interface of each layer, the phase thickness $\alpha$, and the phase thickness $\theta$.

Furthermore, the reflection coefficient of the interface of each layer includes a reflection coefficient $r_2$ of an interface between the wafer film and the wafer substrate, a reflection coefficient $r_3$ of an interface between the first layer and the second layer, and a reflection coefficient $r_4$ of an interface between the second layer and the wafer film.

The computation of the reflection coefficient of the interface of each layer includes: computing the reflection coefficient $r_2$ of the interface between the wafer film and the wafer substrate based on $n_2$ and $n_3$; computing the reflection coefficient $r_3$ of the interface between the wafer film and the wafer substrate based on $n_1$ and $n_4$; and computing the reflection coefficient $r_4$ of the interface between the wafer film and the wafer substrate based on $n_2$ and $n_4$.

The computation of the total reflection coefficient r includes: computing a reflection coefficient $r_{equivalent}$ of an equivalent interface based on $\theta$, $r_2$, and $r_4$; and computing the total reflection coefficient r based on $\alpha$, $r_3$, and $r_{equivalent}$.

As an example, the reflection coefficient can be computed as follows:

$$r_2 = \frac{n_2 - n_3}{n_2 + n_3},$$

$$r_3 = \frac{n_1 - n_4}{n_1 + n_4},$$

$$r_4 = \frac{n_4 - n_2}{n_4 + n_2},$$

The phase thickness $\theta$ can be computed as follows:

$$\theta = \frac{4\pi n_2 d_2}{\lambda},$$

The phase thickness $\alpha$ can be computed as follows:

$$\alpha = \frac{4\pi n_4 d_4}{\lambda},$$

The reflection coefficient $r_{equivalent}$ of the equivalent interface can be computed as follows:

$$r_{equivalent} = \frac{r_4 + r_2 \cdot e^{i \cdot 2\theta}}{1 + r_4 \cdot r_2 \cdot e^{i \cdot 2\theta}},$$

The total reflection coefficient r can be computed as follows:

$$r = \frac{r_3 + r_{equivalent} \cdot e^{i \cdot 2\alpha}}{1 + r_3 r_{equivalent} \cdot e^{i \cdot 2\alpha}},$$

where i is an imaginary unit, and e is a natural constant.

For the above computational formulas, simple modifications may be made according to actual needs, for example, adding a preset coefficient or weight to one of the computational formulas, or the like. For those of ordinary skill in the art, other changes or modifications in different forms can be made on the basis of the above description. It is neither necessary nor impossible to exhaust all the computational formulas herein. However, any obvious changes or modifications derived thereof still fall within the protection scope of the present invention.

In an embodiment, a method for determining spectral parameters of a second layer is provided, including:

obtaining a measured spectrum in a state in which a surface of a wafer has a first layer and the second layer, where the wafer includes a wafer substrate and a wafer film, and parameters of the wafer substrate and the wafer film are known parameters measured in advance; and generating theoretical spectra under different given spectral parameters of the second layer by using a spectrum computation model. The difference from the process of generating a reference spectrum is that the spectral parameters of the wafer film and the wafer substrate are fixed values, and the spectral parameters of the second layer include multiple given values.

The spectral parameters of the second layer are determined based on the theoretical spectra and the measured spectrum.

Specifically, the parameters involved in the spectrum computation model include a refractive index $n_1$ of the first layer, a refractive index $n_2$ of the wafer film, a refractive index $n_3$ of the wafer substrate, a refractive index $n_4$ of the second layer, and a thickness $d_4$ of the second layer, where $n_1$, $n_2$, and $n_3$ are known; and multiple $n_4$ denoted by $[n_{4i}, n_{4j}]$ and multiple $d_4$ denoted by $[d_{4i}, d_{4j}]$ are given in this embodiment.

In this embodiment, the thickness $d_2$ of the wafer film is a known fixed value, and multiple theoretical spectra corresponding to $[n_{1i}, n_{1j}]$ and $[d_{4i}, d_{4j}]$ are computed using the spectrum computation model.

The multiple theoretical spectra can be matched with the measured spectrum, some of which with a matching degree higher than a threshold are screened out, the corresponding refractive index is denoted by $[n_{1j}, n_{1k}]$, and the corresponding thickness is denoted by $[d_{4j}, d_{4k}]$; and if the threshold is set high enough, it is possible to obtain a theoretical spectrum matching the measured spectrum, the corresponding refractive index is denoted by $n_{1p}$, and the corresponding thickness is denoted by $d_{4p}$.

Figure 4:
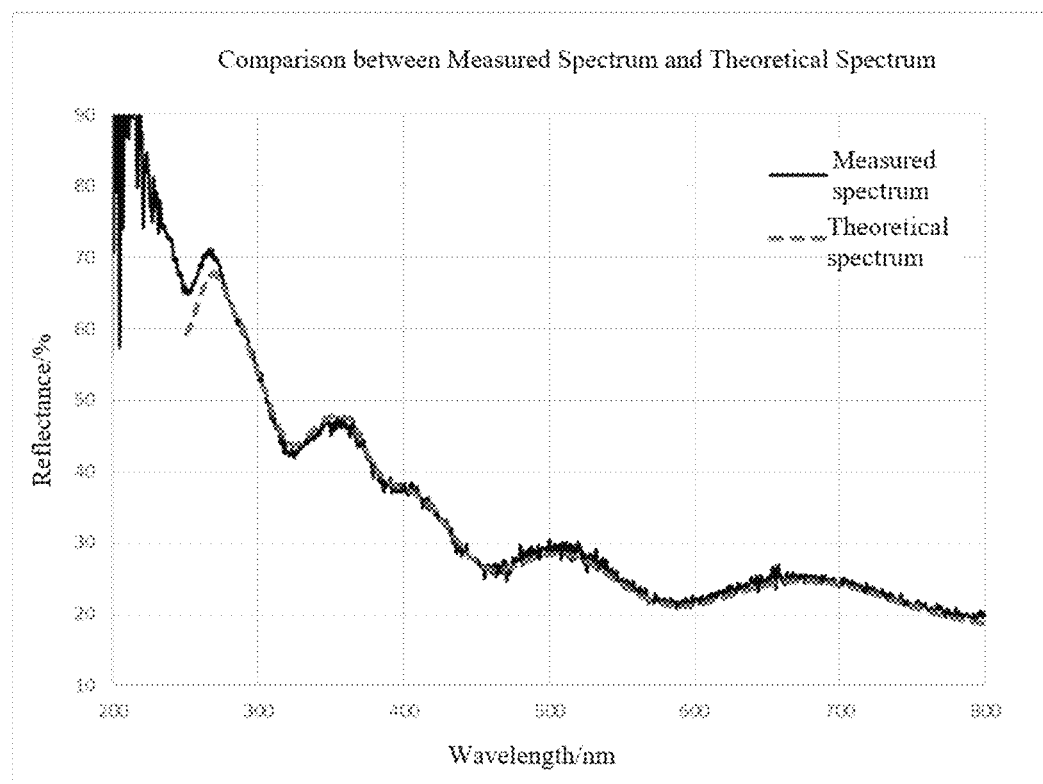
FIG. 4 is a comparison chart between a measured spectrum and another theoretical spectrum according to an embodiment of the present invention.

Therefore, a value can be selected from $[n_{1j}, n_{1k}]$ and $[d_{4j}, d_{4k}]$ respectively as the spectral parameters of the second layer, or $n_{1p}$ and $d_{4p}$ are taken as the spectral parameters of the second layer. FIG. 4 shows a curve of the theoretical spectrum (dotted line) and a curve of the measured spectrum (solid line). If a similarity between these two curves is high enough, the thickness and the refractive index of the second class layer of the theoretical spectrum can be determined as determination results.

In this embodiment, a theoretical spectrum is generated by a given spectral parameter of the second layer, and the value of the spectral parameter of the second layer is determined by matching with the measured spectrum, thereby solving the problem that the spectral parameter of the second layer is difficult to measure and improving measure accuracy.

This embodiment further provides an endpoint detection method for wafer film grinding, which controls grinding in real time based on the above-mentioned online detection method. This method needs to be executed by an electronic device such as a computer or server. Specifically, the method can be executed by the above-mentioned measuring device, including the following operation steps:

using the method for in-situ measurement of film thickness described above to monitor in real time whether a thickness of a wafer film reaches a target thickness during the wafer grinding process; and stopping grinding when the thickness of the wafer film reaches the target thickness.

Those skilled in the art should understand that the embodiments of the present invention may be provided as a method, a system, or a computer program product. Therefore, the present invention may be in the form of a hardware-only embodiment, a software-only embodiment, or an embodiment with a combination of software and hardware. Moreover, the present invention may be in the form of a computer program product that is implemented on one or more computer-usable storage media (including but not limited to a disk memory, a CD-ROM, an optical memory, and the like) that include computer-usable program code.

The present invention is described with reference to the flowcharts and/or block diagrams of the method, the device (system), and the computer program product according to the embodiments of the present invention. It should be understood that a computer program instruction may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, so that the instructions executed by a computer or a processor of another programmable data processing device generate an apparatus for implementing a specific function in one or more processes in the flowcharts and/or in one or more blocks in the block diagrams.

These computer program instructions may be stored in a computer readable memory that can instruct the computer or another programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operation steps are performed on the computer or another programmable device to generate computer-implemented processing. Therefore, the instructions executed on the computer or another programmable device are used to provide steps for implementing a specific function in one or more processes in the flowcharts and/or in one or more blocks in the block diagrams.

Obviously, the above embodiments are merely examples for clear description, rather than limit the implementation. For those of ordinary skill in the art, other changes or modifications in different forms can be made on the basis of the above description. It is neither necessary nor impossible to exhaust all the embodiments herein. However, any obvious changes or modifications derived thereof still fall within the protection scope of the present invention.

What is claimed is:

1. A method for in-situ measurement of film thickness, applied to semiconductor processing in a chemical mechanical polishing (CMP) environment, comprising the following steps:
    generating a measured spectrum based on a reflection spectrum of a wafer film of a wafer and an equivalent light source spectrum, wherein the equivalent light source spectrum is data of a correspondence between wavelength and light intensity generated using reflected light passing through a slurry and a dielectric layer between the slurry and a collimated light source probe with the slurry added to a polishing pad before placing the wafer on the carrier; and the dielectric layer comprises a light-transmitting sealing layer disposed on a polishing disc and the polishing pad, and a bulk water layer formed by the slurry;
    matching the measured spectrum with a reference spectrum library, wherein the reference spectrum library is a collection of reference spectra generated for given thicknesses of the wafer film using a spectrum computation model, or the reference spectra are measured data; the measured data are spectra collected for a wafer film of known thickness; and the thickness of the wafer film is measured using a non-spectral, contact, or non-contact instrument and method; and
    obtaining a thickness of the wafer film corresponding to a reference spectrum that matches the measured spectrum as a detection result;
    monitoring in real time whether a thickness of a wafer film reaches a target thickness; and
    stopping grinding when the thickness of the wafer film reaches the target thickness.

2. The method of claim 1, wherein before the step of generating a measured spectrum based on a reflection spectrum of a wafer film and an equivalent light source spectrum, the method further comprises:
    obtaining the reflected light that is emitted by the collimated light source probe, reflected by a reflector, and passes through the dielectric layer; and
    generating the equivalent light source spectrum using the reflected light.

3. The method of claim 1, wherein when the reference spectrum library is the collection of reference spectra generated for given thicknesses of the wafer film using the spectrum computation model, the spectrum computation model comprises spectral parameters of the wafer, and spectral parameters of a near-surface layer formed by substances between bulk water on a surface of the wafer film and the surface of the wafer film.

4. The method of claim 3, wherein the spectral parameters of the wafer comprise spectral parameters of the wafer film and spectral parameters of a wafer substrate.

5. The method of claim 4, wherein the spectral parameters of the wafer film comprise a refractive index $n_2$ thereof, and the spectral parameters of the wafer substrate comprise a refractive index $n_3$ thereof.

6. The method of claim 3, wherein the near-surface layer is a surface-equivalent layer for simulating the substances between the bulk water on the surface of the wafer film and the surface of the wafer film.

7. The method of claim 6, wherein spectral parameters of the surface-equivalent layer comprise a refractive index $n_1'$ thereof.

8. The method of claim 7, wherein before the step of matching the measured spectrum with a reference spectrum library, the method further comprises:
    obtaining the spectrum computation model;
    determining the spectral parameters of the surface-equivalent layer, the wafer film, and the wafer substrate; and
    computing reference spectra at different given thicknesses of the wafer film using the spectral parameters and the spectrum computation model.

9. The method of claim 3, wherein the near-surface layer comprises a first layer and a second layer, and the second layer is disposed between the first layer and the wafer film.

10. The method of claim 9, wherein spectral parameters of the first layer comprise a refractive index $n_1$ thereof, and spectral parameters of the second layer comprise a refractive index $n_4$ and thickness $d_4$ thereof.

11. The method of claim 9, wherein before the step of matching the measured spectrum with a reference spectrum library, the method further comprises:
    obtaining the spectrum computation model;
    determining the spectral parameters of the first layer, the wafer film, the second layer, the wafer film, and the wafer substrate; and
    computing reference spectra at different given thicknesses of the wafer film using the spectral parameters and the spectrum computation model.

12. A device for in-situ measurement of film thickness, comprising: a processor and a memory connected to the processor, wherein the memory stores instructions that can be executed by the processor, and the instructions comprise the method of claim 1.

* * * * *